(12) United States Patent
Chen et al.

(10) Patent No.: US 11,079,443 B2
(45) Date of Patent: Aug. 3, 2021

(54) SWITCH FAULT DETECTION TECHNIQUES FOR DC-DC CONVERTERS

(71) Applicant: Analog Devices International Unlimited Company, Limerick (IE)

(72) Inventors: Hai Chen, Gilbert, AZ (US); Gregory J. Hughes, Paradise Valley, AZ (US)

(73) Assignee: Analog Devices International Unlimited Company, Limerick (IE)

( * ) Notice: Subject to any disclaimer, the term of this patent is extended or adjusted under 35 U.S.C. 154(b) by 235 days.

(21) Appl. No.: 16/231,008

(22) Filed: Dec. 21, 2018

(65) Prior Publication Data
US 2020/0200831 A1    Jun. 25, 2020

(51) Int. Cl.
| G01R 31/40 | (2020.01) |
| H02M 3/155 | (2006.01) |
| H02M 1/088 | (2006.01) |
| G01R 31/50 | (2020.01) |

(52) U.S. Cl.
CPC ............. *G01R 31/40* (2013.01); *G01R 31/50* (2020.01); *H02M 1/088* (2013.01); *H02M 3/155* (2013.01)

(58) Field of Classification Search
CPC ........ G01R 31/40; G01R 31/50; G01R 31/52; G01R 17/02; G01R 31/026; G01R 31/2621; G01R 3/158; H02M 1/088; H02M 3/155; H02M 1/32; H02M 3/158; H02M 3/1582; H02M 3/156; H05K 13/00
USPC ........................ 323/271, 282–285; 324/750.3
See application file for complete search history.

(56) References Cited

U.S. PATENT DOCUMENTS

| 5,448,441 A | 9/1995 | Raposa |
| 5,672,952 A | 9/1997 | Szepesi |
| 6,407,899 B1 | 6/2002 | Carpenter |
| 7,952,488 B1 | 5/2011 | Zansky et al. |
| 8,471,584 B2 | 6/2013 | Soldi et al. |
| 8,619,445 B1 | 12/2013 | Low et al. |
| 9,367,111 B2 | 6/2016 | Tomas et al. |
| 9,450,490 B2 | 9/2016 | Cavallini et al. |

(Continued)

FOREIGN PATENT DOCUMENTS

| CN | 111352045 A | 6/2020 |
| DE | 102019008819 A1 | 6/2020 |

(Continued)

OTHER PUBLICATIONS

"Korean Application Serial No. 10-2019-0161562, Notice of Preliminary Rejection dated Mar. 29, 2021", w/ English Translation, 22 pgs.

(Continued)

*Primary Examiner* — Melissa J Koval
*Assistant Examiner* — Courtney G McDonnough
(74) *Attorney, Agent, or Firm* — Schwegman Lundberg & Woessner, P.A.

(57) ABSTRACT

Using various techniques, each transistor in a DC-DC converter can have a corresponding voltage detector that can compare a difference of a first voltage at a first terminal of the transistor and a second voltage at a second terminal of the transistor to a threshold voltage. Then, based on at least one comparison, a controller can detect an open circuit or a short circuit in one or more of the transistors regardless of the direction of the load current in the DC-DC converter.

20 Claims, 8 Drawing Sheets

(56) References Cited

U.S. PATENT DOCUMENTS

| | | | |
|---|---|---|---|
| 2004/0145843 A1* | 7/2004 | Winick | H03K 17/302 |
| | | | 361/90 |
| 2007/0007912 A1* | 1/2007 | Yang | H03K 17/6872 |
| | | | 315/291 |
| 2010/0277838 A1* | 11/2010 | Balakrishnan | H02M 1/32 |
| | | | 361/18 |
| 2011/0234255 A1* | 9/2011 | Chobot | H05B 45/50 |
| | | | 324/764.01 |
| 2012/0182032 A1* | 7/2012 | Chen | G01R 31/31724 |
| | | | 324/750.3 |
| 2013/0063121 A1* | 3/2013 | Kasai | H02M 1/32 |
| | | | 323/311 |
| 2014/0117955 A1* | 5/2014 | Zoso | H02M 3/157 |
| | | | 323/271 |
| 2018/0152014 A1 | 5/2018 | Miyoshi et al. | |
| 2019/0199225 A1* | 6/2019 | Futrell | H01F 29/02 |

FOREIGN PATENT DOCUMENTS

| | | |
|---|---|---|
| JP | H08289535 | 11/1996 |
| JP | 4832840 B2 | 9/2011 |
| JP | 5526965 B2 | 4/2014 |

OTHER PUBLICATIONS

"Korean Application Serial No. 10-2019-0161562, Response filed May 14, 2021 to Notice of Preliminary Rejection dated Mar. 29, 2021", w/ English claims, 33 pgs.

\* cited by examiner

SWITCH FAULT DETECTION TECHNIQUES FOR DC-DC CONVERTERS

FIELD OF THE DISCLOSURE

This document pertains generally, but not by way of limitation, to DC/DC converters and, more particularly, fault detection in DC/DC converters.

BACKGROUND

One of the most common challenges in designing portable electronic devices is the generation and maintenance of a regulated voltage from an unregulated voltage source, such as a battery. Typically, a voltage regulator is used for this purpose. A voltage regulator may be designed as a linear regulator or a switching regulator.

A linear regulator provides closed loop control to regulate the voltage at the load. This type of regulator may be used to provide a constant output voltage that has a lower magnitude than the unregulated voltage source.

In contrast, a switching regulator uses an energy-storage element, such as an inductor, to transfer energy from the unregulated power source to the load in discrete bursts. Feedback circuitry may be used to regulate the energy transfer to maintain a constant voltage at the load. Because the switching regulator operates to transfer energy in discrete bursts, it can be configured to step-up or step-down the voltage of the unregulated voltage source. Moreover, switching regulators are generally more efficient than linear regulators.

Various types of switching regulators are commonly used today in portable electronic devices. A buck converter is an inductor-based regulator used to step-down or buck the unregulated voltage source. A boost converter is an inductor-based regulator used to step-up or boost the unregulated voltage source. In some applications, a buck-boost converter may be used to provide a regulated output that is higher, lower or the same as the unregulated voltage source.

SUMMARY OF THE DISCLOSURE

This disclosure describes, among other things, techniques to detect an open circuit or a short circuit in a DC-DC converter, regardless of a direction of a load current in the converter. Thus, the switch fault detection of this disclosure can detect an open circuit or short circuit in a power stage of unidirectional or bidirectional DC-DC converters.

In some aspects, this disclosure is directed to a circuit configured to detect an open circuit or a short circuit in a switched-mode DC-DC converter regardless of a direction of a load current, the circuit comprising: a first voltage detector circuit coupled across a first transistor, the first voltage detector circuit configured to compare a difference of a first reference voltage or an output voltage and a node voltage to a corresponding one of first and second threshold voltages; a second voltage detector circuit coupled across a second transistor, the second voltage detector circuit configured to compare a difference of a second reference voltage and the node voltage to a corresponding one of first and second threshold voltages; and a controller configured to detect an open circuit or a short circuit in at least one of the first transistor and the second transistor based on at least one of the comparisons regardless of the direction of the load current in the DC-DC converter.

In some aspects, this disclosure is directed to a method of detecting an open circuit or a short circuit in a DC-DC converter regardless of current direction, the method comprising: comparing a difference across a first transistor of a first reference voltage or an output voltage and a node voltage to a corresponding one of first and second threshold voltages; comparing a difference across a second transistor of a second reference voltage and the node voltage to a corresponding one of first and second threshold voltages; and detecting an open circuit or a short circuit in at least one of the first transistor and the second transistor based on at least one of the comparisons regardless of the direction of the load current in the DC-DC converter.

In some aspects, this disclosure is directed to a circuit configured to detect an open circuit or a short circuit in a switched-mode DC-DC converter regardless of a direction of a load current, the circuit comprising: a first means for comparing a difference across a first transistor of a first reference voltage or an output voltage and a node voltage to a corresponding one of first and second threshold voltages; a second means for comparing a difference across a second transistor of a second reference voltage and the node voltage to a corresponding one of first and second threshold voltages; and a controller configured to detect an open circuit or a short circuit in at least one of the first transistor and the second transistor based on at least one of the comparisons regardless of the direction of the load current in the DC-DC converter.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized a need to be able to detect an open circuit or a short circuit in a DC-DC converter, regardless of a direction of a load current in the converter. Using various techniques of this disclosure, each transistor in a DC-DC converter can have a corresponding voltage detector that can compare a difference of a first voltage at a first terminal of the transistor and a second voltage at a second terminal of the transistor to a threshold voltage. Then, based on at least one comparison, a controller can detect an open circuit or a short circuit in one or more of the transistors regardless of the direction of the load current in the DC-DC converter.

Figure 1:
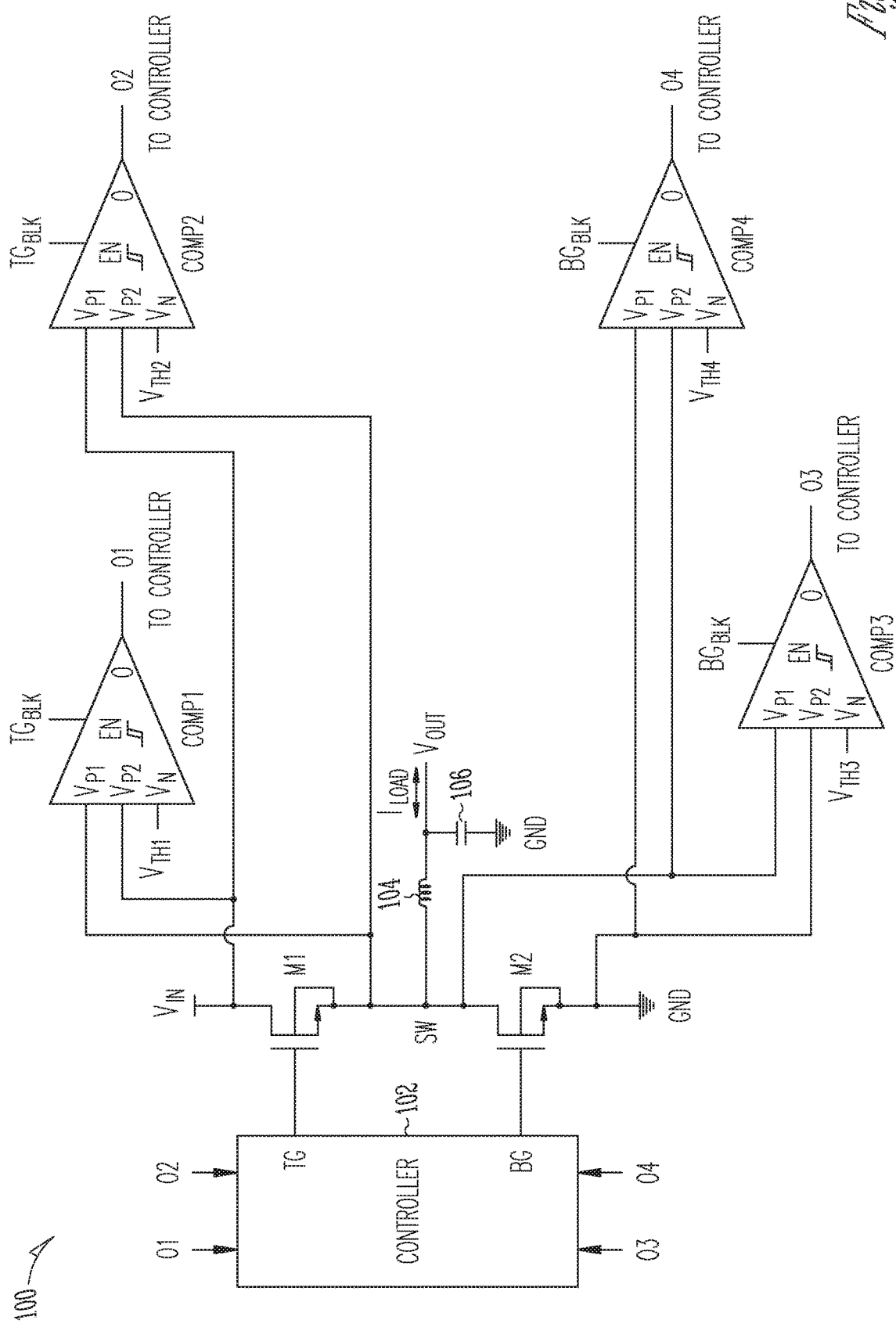
FIG. 1 is a schematic diagram of an example of a buck DC-DC converter that can implement various techniques of this disclosure.

FIG. 1 is a schematic diagram of an example of a buck DC-DC converter that can implement various techniques of this disclosure. The buck converter circuit 100 can include first and second transistors M1, M2, respectively, that are each coupled to and controlled by a controller 102. In particular, the controller 102 is coupled to a control node, e.g., gate terminal TG, of the first transistor M1 and to a control node, e.g., gate terminal BG, of the second transistor M2. The first and second transistors M1, M2 can be field-effect transistors (FET), for example.

An inductor 104 can be coupled to a node SW between the transistors M1 and M2 and to a capacitor 106. A load (not depicted) can be coupled to the output voltage $V_{OUT}$. The controller 102 can control the transistors M1, M2 to turn ON and OFF to control the amount of time the inductor 104 is coupled to the input voltage $V_{IN}$.

In accordance with this disclosure, voltage detector circuits can be included in the switched-mode DC-DC buck converter circuit 100 to detect an open circuit or a short circuit regardless of a direction of a load current $I_{LOAD}$. As described in detail below, a first voltage detector circuit can be coupled across the first transistor M1, a second voltage detector circuit can be coupled across the second transistor M2, and the controller 102 can detect an open circuit or a short circuit in at least one of the first transistor and the second transistor based on comparisons performed by the first and second voltage detector circuits regardless of the direction of the load current in the converter circuit.

In the example configuration of FIG. 1, the first voltage detector circuit can include a first comparator circuit COMP1 and a second comparator circuit COMP2. In some example configurations, at least one of the comparator circuits can include a hysteresis comparator. For purposes of explanation, each of the first comparator COMP1 and the second comparator COMP2 are shown as having three inputs, namely VP1, VP2, and VN. Each of the first comparator COMP1 and the second comparator COMP2 can be coupled across the first transistor M1.

The VP1 and VP2 inputs of the first comparator COMP1 can be coupled, respectively, to a node voltage, e.g., a voltage at node SW, and a first reference voltage, e.g., input voltage $V_{IN}$. The VN input of the first comparator COMP1 can be coupled to a first threshold voltage $V_{TH1}$. The first comparator COMP1 can compare a difference of the node voltage at node SW and the first reference voltage $V_{IN}$, e.g., SW voltage-$V_{IN}$, to the first threshold voltage and, in response, generate a first output "O1" that can be applied to the controller 102.

The second comparator COMP2 can also be coupled across the first transistor M1 with its VP1 and VP2 inputs coupled opposite to the first comparator COMP1. In particular, the VP1 and VP2 inputs of the second comparator COMP2 can coupled, respectively, to the first reference voltage, e.g., input voltage $V_{IN}$, and the node voltage, e.g., a voltage at node SW. The VN input of the second comparator COMP2 can be coupled to a second threshold voltage $V_{TH2}$. The second comparator COMP2 can compare a difference of the first reference voltage $V_{IN}$ and the node voltage at node SW, e.g., $V_{IN}$-SW voltage, to the second threshold voltage and, in response, generate a second output "O2" that can be applied to the controller 102.

The second voltage detector circuit can be configured similar to the first voltage detector circuit. As seen in the example configuration of FIG. 1, the second voltage detector circuit can include a third comparator circuit COMP3 and a fourth comparator circuit COMP4. For purposes of explanation, each of the third comparator COMP3 and the fourth comparator COMP4 are shown as having three inputs, namely VP1, VP2, and VN. Each of the third comparator COMP3 and the fourth comparator COMP4 can be coupled across the second transistor M2.

The VP1 and VP2 inputs of the third comparator COMP3 can be coupled, respectively, to a node voltage, a voltage at node SW, and a second reference voltage, e.g., ground. The VN input of the third comparator COMP3 can be coupled to a third threshold voltage $V_{TH3}$. The third comparator COMP3 can compare a difference of the node voltage at node SW and the second reference voltage, e.g., ground, e.g., SW voltage-ground, to the third threshold voltage and, in response, generate a third output "O3" that can be applied to the controller 102.

The fourth comparator COMP4 can also be coupled across the second transistor M2 with its VP1 and VP2 inputs coupled opposite to the third comparator COMP3. In particular, the VP1 and VP2 inputs of the fourth comparator COMP4 can coupled, respectively, to the second reference voltage, e.g., ground, and the node voltage, e.g., a voltage at node SW. The VN input of the fourth comparator COMP4 can be coupled to a fourth threshold voltage $V_{TH4}$. The fourth comparator COMP4 can compare a difference of the second reference voltage, e.g., ground, and the node voltage at node SW, e.g., ground-SW voltage, to the fourth threshold voltage and, in response, generate a fourth output "O4" that can be applied to the controller 102.

As described in more detail below with respect to FIGS. 2A-2F, the controller 102 can detect an open circuit or a short circuit in at least one of the first transistor M1 and the second transistor M2 based on at least one of the comparisons "O1", "O2", "O3", "O4", regardless of the direction of the load current in the converter circuit 102.

In some example configurations, at least one of the comparator circuits COMP1-COMP4 can include an enable input configured to receive an enable signal. In the example configuration shown in FIG. 1, each of the comparator circuits COMP1-COMP4 are shown as receiving an enable signal. In particular, the comparator circuits COMP1 and COMP2 receive enable signal $TG_{BLK}$ and the comparator circuits COMP3 and COMP4 receive enable signal $BG_{BLK}$. The comparator circuits COMP1 and COMP2 need not be tied to the same enable signal. Similarly, the comparator circuits COMP3 and COMP4 need not be tied to the same enable signal.

Figure 3:
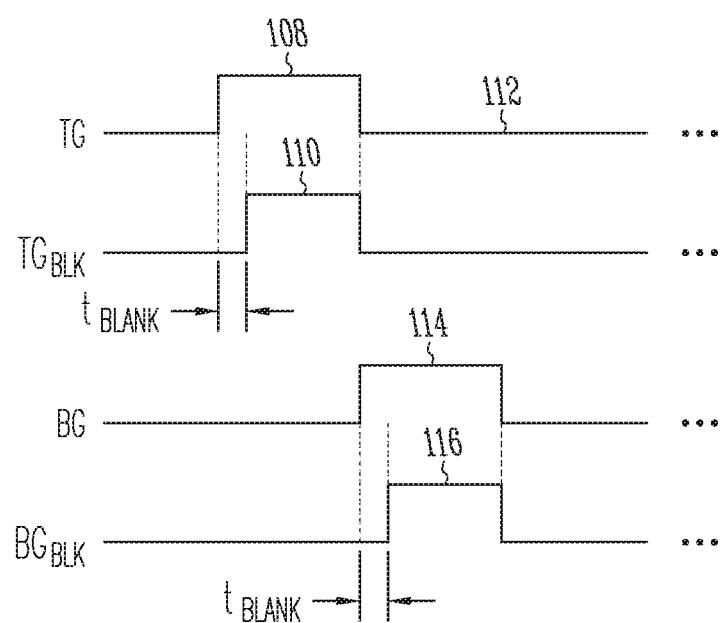
FIG. 3 is an example of a timing diagram between control signals and corresponding enable signals for the buck DC-DC converter circuit of FIG. 1.

As shown in more detail in the timing diagram of FIG. 3, the enable signals can be set to a logic level, e.g., logic high level, after a predetermined time following application of a logic level, e.g., logic high level, of a control signal to either the first transistor M1 or the second transistor M2. In some example configurations, the predetermined time can be adjusted, e.g., using a Serial Peripheral Interface (SPI) communication. In some example implementations, when the enable signal, e.g., enable signal $TG_{BLK}$ or enable signal $BG_{BLK}$, are another logic level, e.g., logic low, the output of the comparator is latched.

A non-limiting theory of operation for detecting open circuit and short circuits in a buck converter circuit regardless of the direction of the load current and in accordance with this disclosure is described below with respect to FIGS. 2A-2F.

Figure 2A:
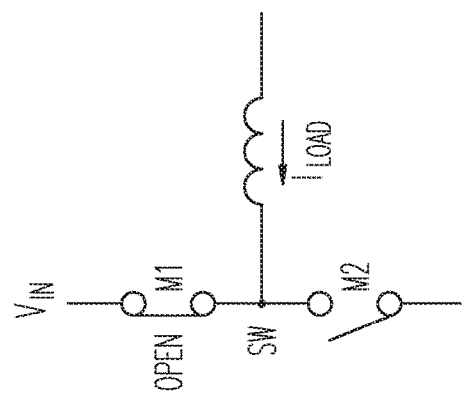
FIGS. 2A-2F are simplified schematic diagrams of a portion of the buck converter circuit of FIG. 1.

FIGS. 2A-2F are simplified schematic diagrams of a portion of the buck converter circuit of FIG. 1. In FIG. 2A, the first transistor M1 is shown closed and the second transistor M2 is shown open with the load current $I_{LOAD}$, which can include the inductor current, flowing from right to left. During normal operation, when the first transistor M1 is ON, the voltage at the node SW is approximately equal to the input voltage $V_{IN}$ given that the ON resistance of the transistor M1 is very low. Thus, a difference of the reference voltage $V_{IN}$ and the node voltage at node SW should be low.

As indicated in FIG. 2A, the first transistor M1 is in an open circuit fault condition and, for normal operation, should be closed. A parasitic capacitance exists between the node SW and ground, which can be charged by the load current. A voltage at the node SW will continue to increase as the parasitic capacitance charges until it exceeds the reference voltage $V_{IN}$.

Using the first voltage detector circuit of FIG. 1, the controller 102 of FIG. 1 can detect the open circuit fault of the first transistor M1. For example, the first comparator COMP1 of FIG. 1 can compare a difference of the node voltage at node SW and the reference voltage $V_{IN}$. If the difference exceeds the first voltage threshold $V_{TH1}$, the controller can determine that there is an open circuit fault with the first transistor M1. For example, if the difference of the node voltage at node SW and the reference voltage $V_{IN}$ exceeds 0.5V-2V, for example, the controller 102 can detect the open circuit fault with the load current flowing from right to left.

Figure 2B:
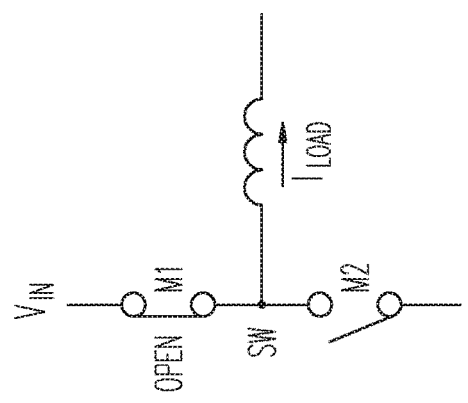

In FIG. 2B, the first transistor M1 is shown closed and the second transistor M2 is shown open with the load current, which can include the inductor current, flowing from left to right, in contrast to FIG. 2A. During normal operation, when the first transistor M1 is ON, the voltage at the node SW is approximately equal to the input voltage $V_{IN}$ given that the ON resistance of the transistor M1 is very low. Thus, a difference of the reference voltage $V_{IN}$ and the node voltage at node SW should be low.

As indicated in FIG. 2B, the first transistor M1 is in an open circuit fault condition and, for normal operation, should be closed. A parasitic capacitance exists between the node SW and ground. As the load current flows out of the node SW, the parasitic capacitance will eventually cause the voltage at node SW to go negative so that a difference between the reference voltage $V_{IN}$ and the node voltage at node SW will be greater than 0, e.g., $V_{IN}$—voltage at node SW is greater than 0.

Using the first voltage detector circuit of FIG. 1, the controller 102 of FIG. 1 can detect the open circuit fault of the first transistor M1. For example, the second comparator COMP2 of FIG. 1 can compare a difference of the reference voltage $V_{IN}$ and node voltage at node SW. If the difference exceeds the second voltage threshold $V_{TH2}$, the controller 102 can determine that there is an open circuit fault with the first transistor M1. For example, if the difference of the reference voltage $V_{IN}$ and node voltage at node SW exceeds 0.5V-2V, for example, the controller 102 can detect the open circuit fault with the load current flowing from left to right.

Figure 2C:
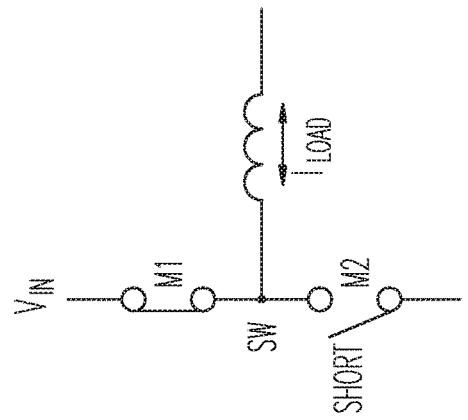

In FIG. 2C, the first transistor M1 is shown closed and the second transistor M2 is shown open with the load current, which can include the inductor current, flowing either from left to right or from right to left. Again, during normal operation, when the first transistor M1 is ON, the voltage at the node SW is approximately equal to the input voltage $V_{IN}$ given that the ON resistance of the transistor M1 is very low. Thus, a difference of the reference voltage $V_{IN}$ and the node voltage at node SW should be low.

As indicated in FIG. 2C, the second transistor M2 is in a short circuit fault condition and, for normal operation, should be open. With the second transistor M2 shorted, the ON resistances of first transistor M1 and second transistor M2 form a resistor divider. For simplicity, assume that the two ON resistances are equals. Then, the voltage at node SW will be half the reference voltage $V_{IN}$.

Using the first voltage detector circuit of FIG. 1, the controller 102 of FIG. 1 can detect the short circuit fault of the second transistor M2. For example, the second comparator COMP2 of FIG. 1 can compare a difference of the reference voltage $V_{IN}$ and node voltage at node SW. If the difference exceeds the second voltage threshold $V_{TH2}$, the controller 102 can determine that there is a short circuit fault with the second transistor M2. For example, if the difference of the reference voltage $V_{IN}$ and node voltage at node SW exceeds 0.5V-2V, for example, the controller 102 can detect the short circuit fault in the second transistor M2 regardless of the direction of the load current.

Figure 2D:
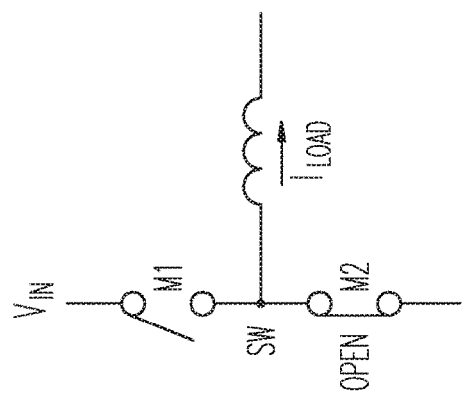

In FIG. 2D, the first transistor M1 is shown open and the second transistor M2 is shown closed with the load current, which can include the inductor current, flowing from left to right. During normal operation, when the second transistor M2 is ON, the voltage at the node SW is approximately at ground given that the ON resistance of the second transistor M2 is very low. Thus, a difference of the reference voltage ground and the node voltage at node SW should be low.

As indicated in FIG. 2D, the second transistor M2 is in an open circuit fault condition and, for normal operation, should be closed. A parasitic capacitance exists between the node SW and ground. As the load current flows out of the node SW, the parasitic capacitance will eventually cause the voltage at node SW to go negative so that a difference between the node voltage at node SW and the reference voltage ground will be less than 0, e.g., voltage at node SW—ground is less than 0.

Using the second voltage detector circuit of FIG. 1, the controller 102 of FIG. 1 can detect the open circuit fault of the second transistor M2. For example, the third comparator COMP3 of FIG. 1 can compare a difference of the node voltage at node SW and the reference voltage ground. If the difference exceeds the third voltage threshold $V_{TH3}$, the controller 102 can determine that there is an open circuit fault with the second transistor M2. For example, if the difference of the node voltage at node SW and the reference voltage ground is less than −0.5V to −2V, for example, the controller 102 can detect the open circuit fault with the load current flowing from left to right.

Figure 2E:
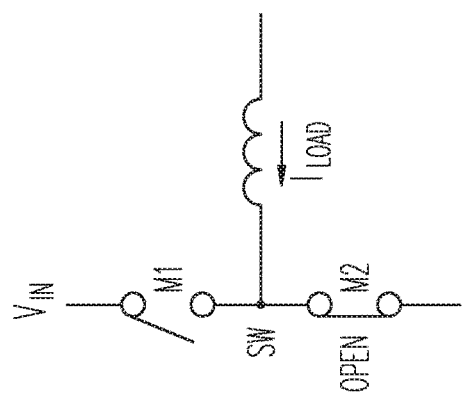

In FIG. 2E, the first transistor M1 is shown open and the second transistor M2 is shown closed with the load current, which can include the inductor current, flowing from right to left. During normal operation, when the second transistor M2 is ON, the voltage at the node SW is approximately at ground given that the ON resistance of the second transistor M2 is very low. Thus, a difference of the reference voltage ground and the node voltage at node SW should be low.

As indicated in FIG. 2E, the second transistor M2 is in an open circuit fault condition and, for normal operation, should be closed. A parasitic capacitance exists between the node SW and ground, which can be charged by the load current. A voltage at the node SW will continue to increase as the parasitic capacitance charges so that a difference between the node voltage at node SW and the reference voltage ground will be greater than 0, e.g., voltage at node SW—ground is greater than 0.

Using the second voltage detector circuit of FIG. 1, the controller 102 of FIG. 1 can detect the open circuit fault of the second transistor M2. For example, the third comparator COMP3 of FIG. 1 can compare a difference of the node voltage at node SW and the reference voltage ground. If the difference exceeds the third voltage threshold $V_{TH3}$, the controller 102 can determine that there is an open circuit fault with the second transistor M2. For example, if the difference of the node voltage at node SW and the reference voltage ground exceeds 0.5V-2V, for example, the controller 102 can detect the open circuit fault with the load current flowing from right to left.

Figure 2F:
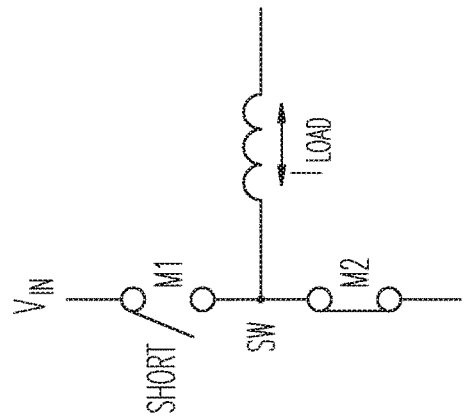

In FIG. 2F, the first transistor M1 is shown open and the second transistor M2 is shown closed with the load current, which can include the inductor current, flowing from either left to right or right to left. During normal operation, when the second transistor M2 is ON, the voltage at the node SW is approximately at ground given that the ON resistance of the second transistor M2 is very low. Thus, a difference of the reference voltage ground and the node voltage at node SW should be low.

As indicated in FIG. 2F, the first transistor M1 is in a short circuit fault condition and, for normal operation, should be open. With the first transistor M1 shorted, the ON resistances of first transistor M1 and second transistor M2 form a resistor divider. For simplicity, assume that the two ON resistances are equals. Then, the voltage at node SW will be half the reference voltage $V_{IN}$.

Using the second voltage detector circuit of FIG. 1, the controller 102 of FIG. 1 can detect the short circuit fault of the first transistor M1. For example, the third comparator COMP3 of FIG. 1 can compare a difference of the reference voltage ground and node voltage at node SW. If the difference exceeds the third voltage threshold $V_{TH3}$, the controller 102 can determine that there is a short circuit fault with the first transistor M1. For example, if the difference of the node voltage at node SW and the reference voltage ground exceeds 0.5V-2V, for example, the controller 102 can detect the short circuit fault in the first transistor M1 regardless of the direction of the load current.

Using these techniques, first and second voltage detector circuits, each coupled across a respective transistor, can be used to detect an open circuit or a short circuit in the buck DC-DC converter circuit of FIG. 1, regardless of the direction of the load current, e.g., unidirectional or bidirectional load current. As described above with respect to FIG. 1, the first voltage detector circuit can include a first pair of comparator circuits, and the second voltage detector circuit can include a second pair of comparator circuits.

FIG. 3 is an example of a timing diagram between control signals and corresponding enable signals for the buck DC-DC converter circuit of FIG. 1. As mentioned above, in some example configurations, at least one of the comparator circuits, e.g., COMP1-COMP4 of FIG. 1, can include an enable input configured to receive an enable signal. In FIG. 1, the comparator circuits COMP1 and COMP2 receive enable signal $TG_{BLK}$ and the comparator circuits COMP3 and COMP4 receive enable signal $BG_{BLK}$.

When the control signal TG toggles to a first logic state to turn ON the first transistor M1 in FIG. 1, spiking can occur. It can be desirable to add a time delay to at least one of the comparator circuits to prevent erroneous detection of a short circuit fault between the time when the control signal TG is applied and when the comparator circuit is enabled.

Referring now to FIG. 3, the control signal TG toggles to a logic level 108, e.g., logic high, to turn the first transistor M1 ON in the example configuration. After a time delay $t_{BLANK}$, the controller 102 of FIG. 1 can output an enable signal $TG_{BLK}$ having a logic level 110, e.g., logic high, to at least one of the comparator circuits COMP1 and COMP2 of FIG. 1.

Similarly, after the control signal TG toggles to a logic level 112, e.g., logic low, to turn the first transistor M1 OFF, the control signal BG toggles to a logic level 114, e.g., logic high, to turn the second transistor M2 ON in the example configuration. After a time delay $t_{BLANK}$, the controller 102 of FIG. 1 can output an enable signal $BG_{BLK}$ having a logic level 116, e.g., logic high, to at least one of the comparator circuits COMP3 and COMP4 of FIG. 1. In some example configurations, the two time delays $t_{BLANK}$ can be the same. In some example configurations, the predetermined time can be adjusted, e.g., using a Serial Peripheral Interface (SPI) communication.

In addition to buck DC-DC converter circuits, the techniques of this disclosure can also be used in combination with other DC-DC converter circuits including, for example, boost DC-DC converter circuits, non-inverting buck-boost DC-DC converter circuits, inverting buck-boost DC-DC converter circuits, and H-bridge converter circuits, as shown and described with respect to FIGS. 4-7.

Figure 4:
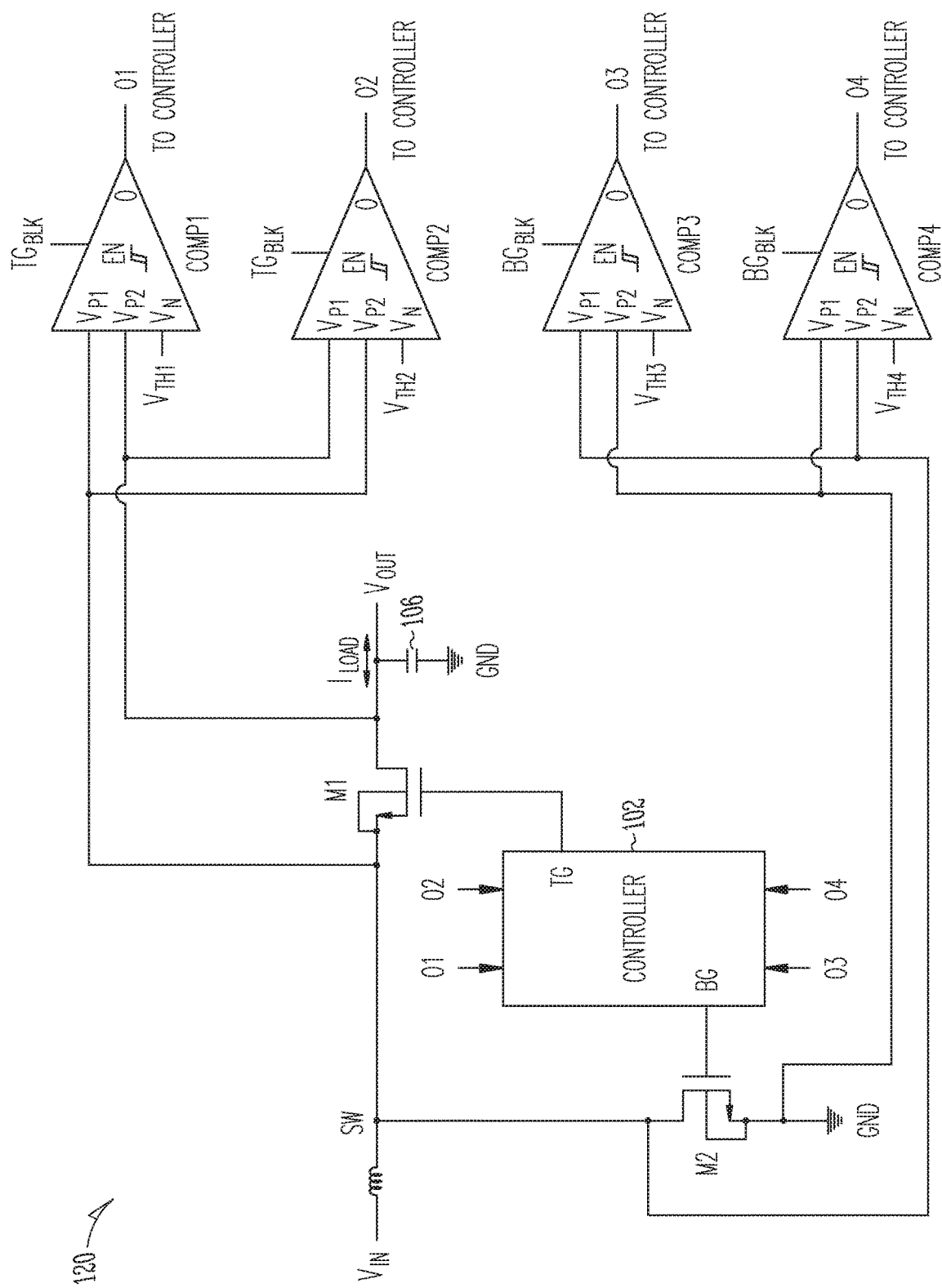
FIG. 4 is a schematic diagram of an example of a boost DC-DC converter that can implement various techniques of this disclosure.

FIG. 4 is a schematic diagram of an example of a boost DC-DC converter that can implement various techniques of this disclosure. The boost converter circuit 120 can include first and second transistors M1, M2, respectively, that are each coupled to and controlled by a controller 102. In particular, the controller 102 is coupled to a control node, e.g., gate terminal TG, of the first transistor M1 and to a control node, e.g., gate terminal BG, of the second transistor M2. The first and second transistors M1, M2 can be field-effect transistors (FET), for example.

An inductor 104 is coupled between the input voltage $V_{IN}$ and a node SW, and the node SW is coupled to both transistors M1 and M2. The first transistor is coupled to a capacitor 106. A load (not depicted) can be coupled to the output voltage $V_{OUT}$. The controller 102 controls the transistors M1, M2 to turn ON and OFF.

Like in FIG. 1, voltage detector circuits can be included in the switched-mode DC-DC boost converter circuit 120 to detect an open circuit or a short circuit regardless of a direction of a load current $I_{LOAD}$. Similar to FIG. 1, a first voltage detector circuit can be coupled across the first transistor M1, a second voltage detector circuit can be coupled across the second transistor M2, and the controller 102 can detect an open circuit or a short circuit in at least one of the first transistor and the second transistor based on comparisons performed by the first and second voltage detector circuits regardless of the direction of the load current in the converter circuit.

In the example configuration of FIG. 4, the first voltage detector circuit can include a first comparator circuit COMP1 and a second comparator circuit COMP2. In some example configurations, at least one of the comparator circuits can include a hysteresis comparator. For purposes of explanation, each of the first comparator COMP1 and the second comparator COMP2 are shown as having three inputs, namely VP1, VP2, and VN. Each of the first comparator COMP1 and the second comparator COMP2 can be coupled across the first transistor M1.

The VP1 and VP2 inputs of the first comparator COMP1 can be coupled, respectively, to a node voltage, e.g., a voltage at node SW, and an output voltage, e.g., voltage $V_{OUT}$. The VN input of the first comparator COMP1 can be coupled to a first threshold voltage $V_{TH1}$. The first comparator COMP1 can compare a difference of the node voltage at node SW and the output voltage $V_{OUT}$, e.g., SW voltage-$V_{OUT}$, to the first threshold voltage and, in response, generate a first output "O1" that can be applied to the controller 102.

The second comparator COMP2 can also be coupled across the first transistor M1 with its VP1 and VP2 inputs coupled opposite to the first comparator COMP1. In particular, the VP1 and VP2 inputs of the second comparator COMP2 can coupled, respectively, to the output voltage, e.g., output voltage $V_{OUT}$, and the node voltage, e.g., a voltage at node SW. The VN input of the second comparator COMP2 can be coupled to a second threshold voltage $V_{TH2}$. The second comparator COMP2 can compare a difference of the output voltage $V_{OUT}$ and the node voltage at node SW, e.g., $V_{OUT}$-SW voltage, to the second threshold voltage and, in response, generate a second output "O2" that can be applied to the controller 102.

The second voltage detector circuit can be configured similar to the first voltage detector circuit. As seen in the example configuration of FIG. 4, the second voltage detector circuit can include a third comparator circuit COMP3 and a fourth comparator circuit COMP4. For purposes of explanation, each of the third comparator COMP3 and the fourth comparator COMP4 are shown as having three inputs, namely VP1, VP2, and VN. Each of the third comparator COMP3 and the fourth comparator COMP4 can be coupled across the second transistor M2.

The VP1 and VP2 inputs of the third comparator COMP3 can be coupled, respectively, to a node voltage, e.g., a voltage at node SW, and a reference voltage, e.g., ground. The VN input of the third comparator COMP3 can be coupled to a third threshold voltage $V_{TH3}$. The third comparator COMP3 can compare a difference of the node voltage at node SW and the reference voltage, e.g., ground, e.g., SW voltage-ground, to the third threshold voltage and, in response, generate a third output "O3" that can be applied to the controller 102.

The fourth comparator COMP4 can also be coupled across the second transistor M2 with its VP1 and VP2 inputs coupled opposite to the third comparator COMP3. In particular, the VP1 and VP2 inputs of the fourth comparator COMP4 can coupled, respectively, to the reference voltage, e.g., ground, and the node voltage, e.g., a voltage at node SW. The VN input of the fourth comparator COMP4 can be coupled to a fourth threshold voltage $V_{TH4}$. The fourth comparator COMP4 can compare a difference of the reference voltage, e.g., ground, and the node voltage at node SW, e.g., ground-SW voltage, to the fourth threshold voltage and, in response, generate a fourth output "O4" that can be applied to the controller 102. The controller 102 is configured to detect an open circuit or a short circuit in at least one of the transistors M1-M2 based on at least one of the comparisons regardless of the direction of the load current in the DC-DC converter.

Figure 5:
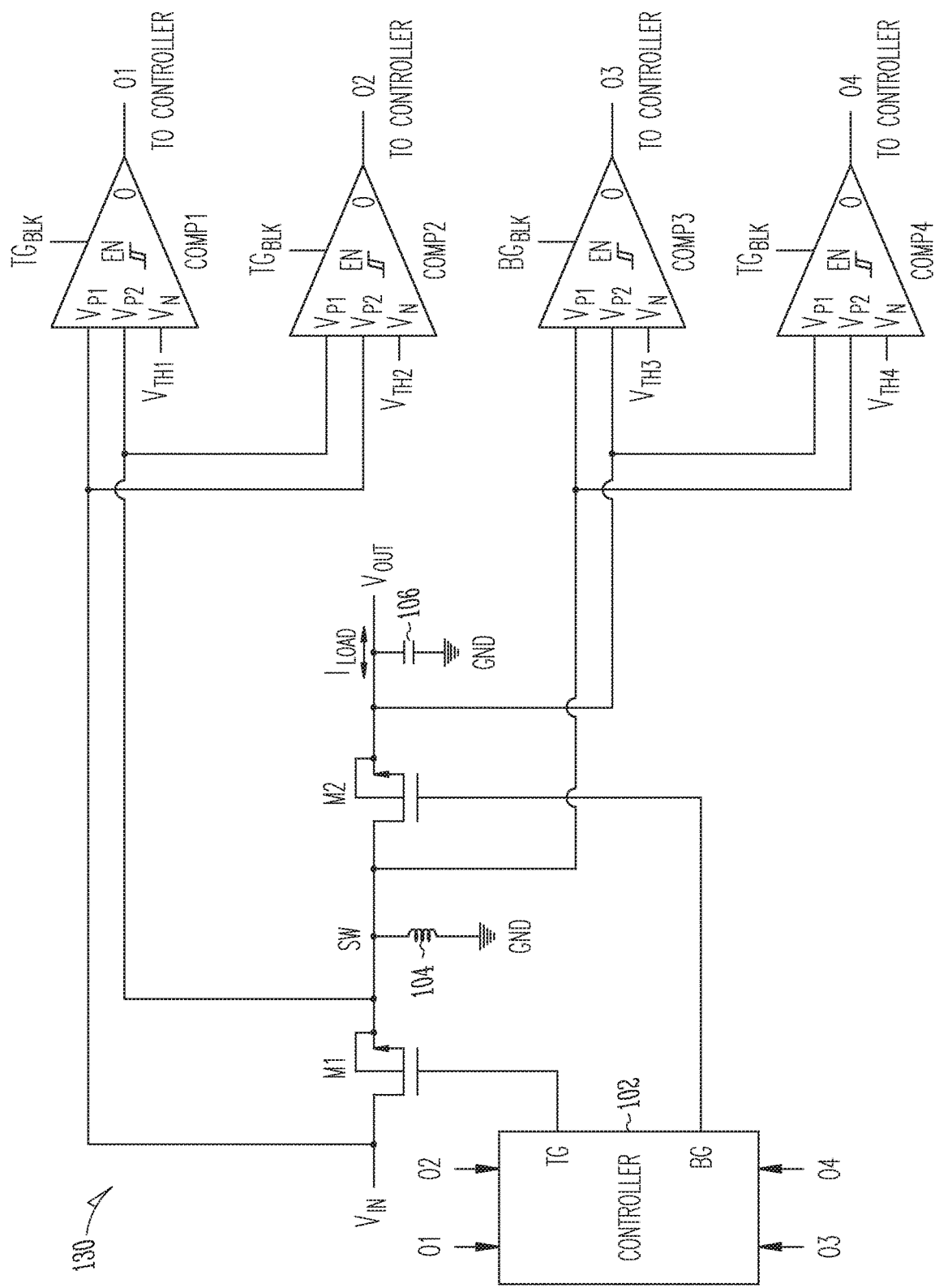
FIG. 5 is a schematic diagram of an example of an inverting buck-boost DC-DC converter that can implement various techniques of this disclosure.

FIG. 5 is a schematic diagram of an example of an inverting buck-boost DC-DC converter that can implement various techniques of this disclosure. The inverting buck-boost converter circuit 130 can include first and second transistors M1, M2, respectively, that are each coupled to and controlled by a controller 102. In particular, the controller 102 is coupled to a control node, e.g., gate terminal TG, of the first transistor M1 and to a control node, e.g., gate terminal BG, of the second transistor M2. The first and second transistors M1, M2 can be field-effect transistors (FET), for example.

The first and second transistors M1, M2 can be coupled together at a node SW. An inductor 104 can be coupled between the node SW and ground, and a capacitor can be coupled to the second transistor M2 at the output. A load (not depicted) can be coupled to the output voltage $V_{OUT}$. The controller 102 controls the transistors M1, M2 to turn ON and OFF.

Voltage detector circuits can be included in the switched-mode DC-DC inverting buck-boost converter circuit 130 to detect an open circuit or a short circuit regardless of a direction of a load current $I_{LOAD}$. A first voltage detector circuit can be coupled across the first transistor M1, a second voltage detector circuit can be coupled across the second transistor M2, and the controller 102 can detect an open circuit or a short circuit in at least one of the first transistor and the second transistor based on comparisons performed by the first and second voltage detector circuits regardless of the direction of the load current in the converter circuit.

The VP1 and VP2 inputs of the first comparator COMP1 can be coupled, respectively, to a first reference voltage, e.g., input voltage $V_{IN}$, and a node voltage, e.g., a voltage at node SW. The VN input of the first comparator COMP1 can be coupled to a first threshold voltage $V_{TH1}$. The first comparator COMP1 can compare a difference of the first reference voltage $V_{IN}$ and the node voltage at node SW, e.g., $V_{IN}$-SW voltage, to the first threshold voltage and, in response, generate a first output "O1" that can be applied to the controller 102.

The second comparator COMP2 can also be coupled across the first transistor M1 with its VP1 and VP2 inputs coupled opposite to the first comparator COMP1. In particular, the VP1 and VP2 inputs of the second comparator COMP2 can coupled, respectively, to the node voltage, e.g., a voltage at node SW, and the first reference voltage, e.g., input voltage $V_{IN}$. The VN input of the second comparator COMP2 can be coupled to a second threshold voltage $V_{TH2}$. The second comparator COMP2 can compare a difference of the node voltage at node SW and the first reference voltage $V_{IN}$, e.g., SW voltage-$V_{IN}$, to the second threshold voltage and, in response, generate a second output "O2" that can be applied to the controller 102.

The VP1 and VP2 inputs of the third comparator COMP3 can be coupled, respectively, to a node voltage, e.g., a voltage at node SW, and an output voltage, e.g., voltage $V_{OUT}$. The VN input of the third comparator COMP3 can be coupled to a third threshold voltage $V_{TH3}$. The third comparator COMP3 can compare a difference of the node voltage at node SW and the output voltage $V_{OUT}$, e.g., SW voltage-$V_{OUT}$, to the third threshold voltage and, in response, generate a third output "O3" that can be applied to the controller 102.

The fourth comparator COMP4 can also be coupled across the second transistor M2 with its VP1 and VP2 inputs coupled opposite to the third comparator COMP3. In particular, the VP1 and VP2 inputs of the fourth comparator COMP4 can coupled, respectively, to the output voltage, e.g., output voltage $V_{OUT}$, and the node voltage, e.g., a voltage at node SW. The VN input of the fourth comparator COMP4 can be coupled to a fourth threshold voltage $V_{TH4}$. The fourth comparator COMP4 can compare a difference of the output voltage $V_{OUT}$ and the node voltage at node SW, e.g., $V_{OUT}$-SW voltage, to the fourth threshold voltage and, in response, generate a second output "O4" that can be applied to the controller 102. The controller is configured to detect an open circuit or a short circuit in at least one of the transistors M1-M2 based on at least one of the comparisons regardless of the direction of the load current in the DC-DC converter.

In addition to the DC-DC converter circuits described above, various techniques of this disclosure can be used in combination with non-inverting buck-boost and H-bridge converter circuits, as described below with respect to FIGS. 6 and 7. Because non-inverting buck-boost and H-bridge converter circuits each use four transistors, four voltage detector circuits can be used to detect open circuits and short circuits.

Figure 6:
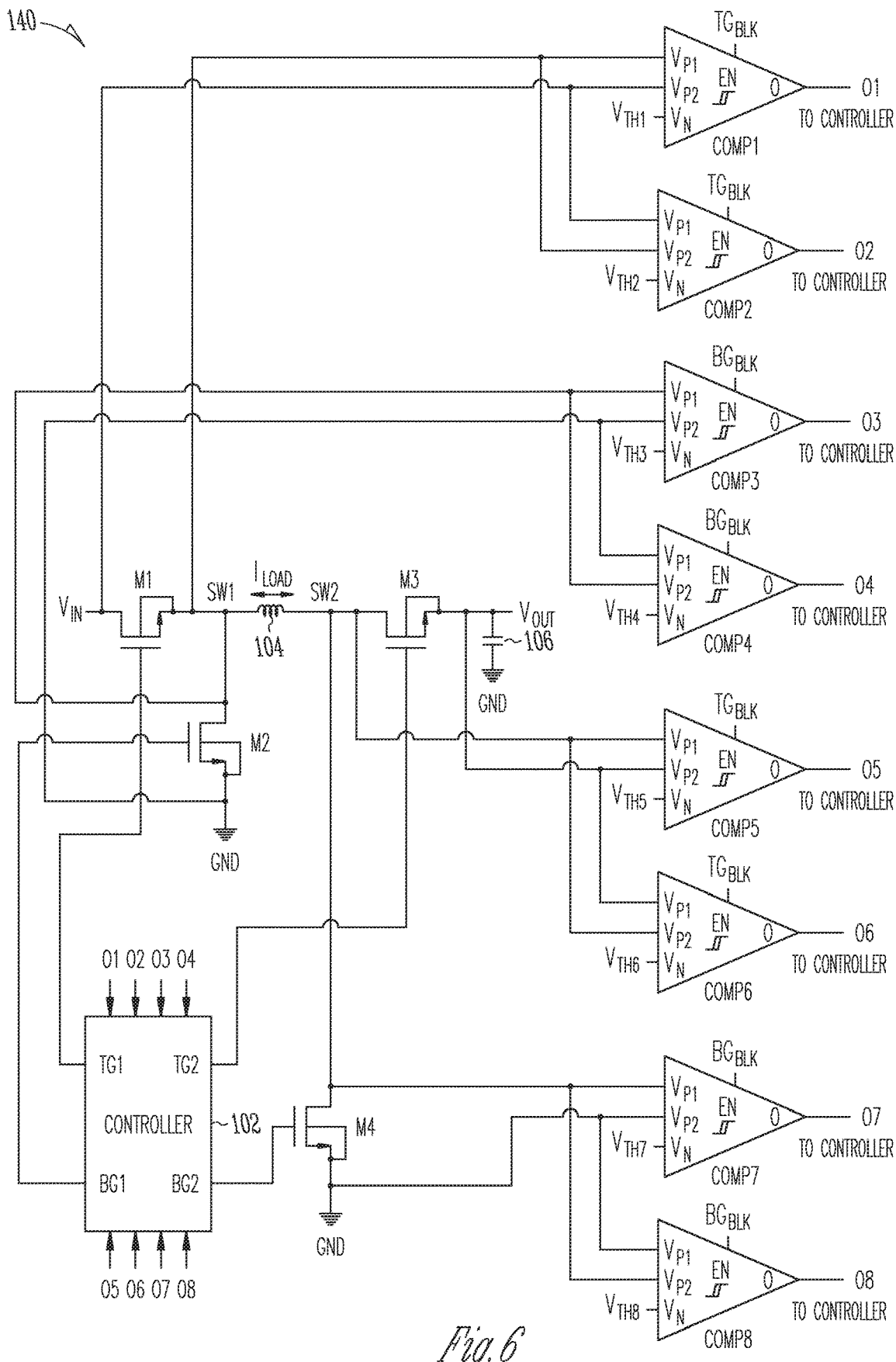
FIG. 6 is a schematic diagram of an example of a non-inverting buck-boost DC-DC converter that can implement various techniques of this disclosure.

FIG. 6 is a schematic diagram of an example of a non-inverting buck-boost DC-DC converter that can implement various techniques of this disclosure. The non-inverting buck-boost converter circuit 140 can include four transistors M1-M4 that are each coupled to and controlled by a controller 102. In particular, the controller 102 is coupled to corresponding control nodes, e.g., gate terminals, of the four transistors, e.g., gate terminals TG1, BG1, TG2, and BG2. The transistors M1-M4 can be field-effect transistors (FET), for example.

An inductor 104 is coupled between transistors M1 and M3. The transistor M2 can be coupled to ground at a node SW1 between the transistor M1 and a first terminal of the inductor 104. The transistor M4 can be coupled to ground at a node SW2 between the transistor M3 and a second terminal of the inductor 104. A load (not depicted) can be coupled to the output voltage $V_{OUT}$. The controller 102 controls the transistors M1-M4 to turn ON and OFF.

The comparators COMP1 and COMP2 can be coupled across the transistor M1 between a first reference voltage, e.g., input voltage $V_{IN}$, and a node voltage, e.g., a voltage at node SW1. The VP1, VP2, and VPN inputs of the comparators COMP1 and COMP2 can be coupled similar to the VP1, VP2, and VPN inputs of the comparators COMP1 and COMP2 of FIG. 1 and, for purposes of conciseness, will not be described in detail again.

The first comparator COMP1 can compare a difference of the node voltage at node SW1 and the first reference voltage $V_{IN}$, e.g., SW1 voltage-$V_{IN}$, to the first threshold voltage and, in response, generate a first output "O1" that can be applied to the controller 102. The second comparator COMP2 can compare a difference of the first reference voltage $V_{IN}$ and the node voltage at node SW1, e.g., $V_{IN}$-SW1 voltage, to the second threshold voltage and, in response, generate a second output "O2" that can be applied to the controller 102.

The comparators COMP3 and COMP4 can be coupled across the transistor M2 between the node voltage, e.g., a voltage at node SW1, and a second reference voltage, e.g., ground. The VP1, VP2, and VPN inputs of the comparators COMP3 and COMP4 can be coupled similar to the VP1, VP2, and VPN inputs of the comparators COMP3 and COMP4 of FIG. 1 and, for purposes of conciseness, will not be described in detail again.

The third comparator COMP3 can compare a difference of the node voltage at node SW1 and the second reference voltage, e.g., SW1 voltage-ground, to the third threshold voltage and, in response, generate a third output "O3" that can be applied to the controller 102. The fourth comparator COMP4 can compare a difference of the second reference voltage, e.g., ground, and the node voltage at node SW1, e.g., ground-SW1 voltage, to the fourth threshold voltage and, in response, generate a fourth output "O4" that can be applied to the controller 102.

As indicated above, two additional voltage detector circuits can be used to detect open circuits and short circuits in the two additional transistors M3 and M4 of the non-inverting buck-boost converter circuit 140. The circuit 140 of FIG. 6 can include a third voltage detector circuit having comparators COMP5 and COMP6 that can be coupled across the transistor M3 between a second node voltage, e.g., a voltage at node SW2, and an output voltage, e.g., output voltage $V_{OUT}$. Each of the comparators COMP5 and COMP6 can receive a corresponding threshold voltage $V_{TH5}$, $V_{TH6}$. The VP1, VP2, and VPN inputs of the comparators COMP5 and COMP6 can be coupled similar to the VP1, VP2, and VPN inputs of the comparators COMP1 and COMP2 of FIG. 4 and, for purposes of conciseness, will not be described in detail again. The comparators COMP5 and COMP6 can be configured to compare a difference of the output voltage and the second node voltage at SW2 to a corresponding threshold voltage $V_{TH5}$, $V_{TH6}$ and, in response, generate corresponding fifth and sixth outputs "O5" and "O6" that can be applied to the controller 102.

In addition, the circuit 140 of FIG. 6 can include a fourth voltage detector circuit having comparators COMP7 and COMP8 that can be coupled across the transistor M4 between a second node voltage, e.g., a voltage at node SW2, and a second reference voltage, e.g., ground. Each of the comparators COMP7 and COMP8 can receive a corresponding threshold voltage $V_{TH7}$, $V_{TH8}$. The VP1, VP2, and VPN inputs of the comparators COMP7 and COMP8 can be coupled similar to the VP1, VP2, and VPN inputs of the comparators COMP3 and COMP4 of FIG. 4 and, for purposes of conciseness, will not be described in detail again. The comparators COMP7 and COMP8 can be configured to compare a difference of the second node voltage, e.g., a voltage at node SW2, and a second reference voltage, e.g., ground, to a corresponding threshold voltages $V_{TH7}$, $V_{TH8}$ and, in response, generate corresponding seventh and eight outputs "O7" and "O8" that can be applied to the controller 102. The controller is configured to detect an open circuit or a short circuit in at least one of the transistors M1-M4 based on at least one of the comparisons regardless of the direction of the load current in the DC-DC converter.

Figure 7:
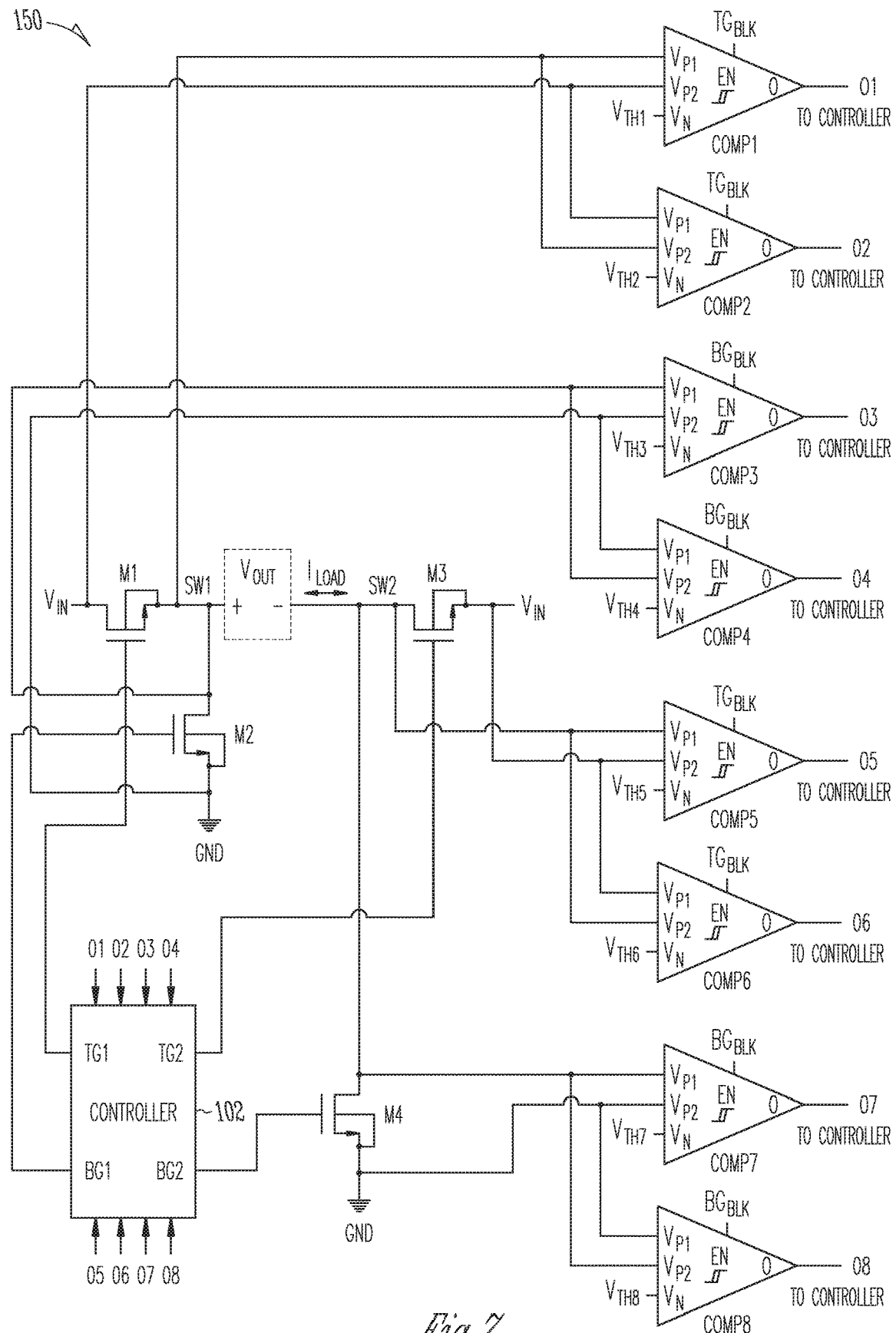
FIG. 7 is a schematic diagram of an example of an H-bridge DC-DC converter that can implement various techniques of this disclosure.

FIG. 7 is a schematic diagram of an example of an H-bridge DC-DC converter that can implement various techniques of this disclosure. The H-bridge converter circuit 150 can include four transistors M1-M4 that are each coupled to and controlled by a controller 102. In particular, the controller 102 is coupled to corresponding control nodes, e.g., gate terminals, of the four transistors, e.g., gate terminals TG1, BG1, TG2, and BG2. The transistors M1-M4 can be field-effect transistors (FET), for example.

The first transistor M1 can be coupled between a first reference voltage, e.g., input voltage $V_{IN}$, and a first node voltage, e.g., voltage at node SW1, and the second transistor M2 can be coupled between the first node voltage, e.g., voltage at node SW1, and a second reference voltage, e.g., ground. The third transistor M3 can be coupled between the first reference voltage, e.g., input voltage $V_{IN}$, and a second node voltage, e.g., voltage at node SW2, and the fourth transistor M4 can be coupled between the second node voltage, e.g., voltage at node SW2, and a second reference voltage, e.g., ground. The output voltage $V_{OUT}$ is between the first node voltage SW1 and the second node voltage SW2. The controller 102 controls the transistors M1-M4 to turn ON and OFF.

The comparators COMP1 and COMP2 can be coupled across the transistor M1 and the comparator COMP3 and COMP4 can be coupled across the transistor M2. The VP1, VP2, and VPN inputs of the comparators COMP1-COMP4 can be coupled similar to the VP1, VP2, and VPN inputs of the comparators COMP1-COMP4 of FIG. 6 and, for purposes of conciseness, will not be described in detail again.

The first comparator COMP1 can compare a difference of the node voltage at node SW1 and the first reference voltage $V_{IN}$, e.g., SW1 voltage-$V_{IN}$, to the first threshold voltage and, in response, generate a first output "O1" that can be applied to the controller 102. The second comparator COMP2 can compare a difference of the first reference voltage $V_{IN}$ and the node voltage at node SW1, e.g., $V_{IN}$-SW1 voltage, to the second threshold voltage and, in response, generate a second output "O2" that can be applied to the controller 102.

The third comparator COMP3 can compare a difference of the node voltage at node SW1 and the second reference voltage, e.g., SW1 voltage-ground, to the third threshold voltage and, in response, generate a third output "O3" that can be applied to the controller 102. The fourth comparator COMP4 can compare a difference of the second reference voltage, e.g., ground, and the node voltage at node SW1, e.g., ground-SW1 voltage, to the fourth threshold voltage and, in response, generate a fourth output "O4" that can be applied to the controller 102.

Like in FIG. 6, two additional voltage detector circuits can be used to detect open circuits and short circuits in the two additional transistors M3 and M4 of the non-inverting buck-boost converter circuit 150. The circuit 150 of FIG. 7 can include a third voltage detector circuit having comparators COMP5 and COMP6 that can be coupled across the transistor M3 between a second node voltage, e.g., a voltage at node SW2, and the first reference voltage, e.g., input voltage $V_{IN}$. Each of the comparators COMP5 and COMP6 can receive a corresponding threshold voltage $V_{TH5}$, $V_{TH6}$. The VP1, VP2, and VPN inputs of the comparators COMP5 and COMP6 can be coupled similar to the VP1, VP2, and VPN inputs of the comparators COMP1 and COMP2 of FIG. 4 and, for purposes of conciseness, will not be described in detail again. The comparators COMP5 and COMP6 can be configured to compare a difference of the input voltage and the second node voltage to a corresponding threshold voltage $V_{TH5}$, $V_{TH6}$ and, in response, generate corresponding fifth and sixth outputs "O5" and "O6" that can be applied to the controller 102.

In addition, the circuit 150 of FIG. 7 can include a fourth voltage detector circuit having comparators COMP7 and COMP8 that can be coupled across the transistor M4 between a second node voltage, e.g., a voltage at node SW2, and a second reference voltage, e.g., ground. Each of the comparators COMP7 and COMP8 can receive a corresponding threshold voltage $V_{TH7}$, $V_{TH8}$. The VP1, VP2, and VPN inputs of the comparators COMP7 and COMP8 can be coupled similar to the VP1, VP2, and VPN inputs of the comparators COMP3 and COMP4 and, for purposes of conciseness, will not be described in detail again. The comparators COMP7 and COMP8 can be configured to compare a difference of the second node voltage, e.g., a voltage at node SW2, and a second reference voltage, e.g., ground, to a corresponding threshold voltages $V_{TH7}$, $V_{TH8}$ and, in response, generate corresponding seventh and eight outputs "O7" and "O8" that can be applied to the controller 102. The controller is configured to detect an open circuit or a short circuit in at least one of the transistors M1-M4 based on at least one of the comparisons regardless of the direction of the load current in the DC-DC converter.

Figure 8:
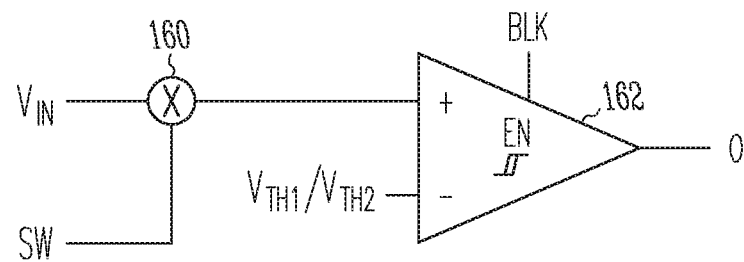
FIG. 8 is a schematic diagram of an example of alternative comparator configuration that can be used to implement various techniques of this disclosure.

FIG. 8 is a schematic diagram of an example of alternative comparator configuration that can be used to implement various techniques of this disclosure. In the example configuration shown in FIG. 8, a first voltage, e.g., reference voltage $V_{IN}$, and a second voltage, e.g., a voltage at node SW, can be applied to a subtraction circuit 160. The output of the subtraction circuit 160 is a differential signal $V_{SNS}=V_{IN}$-SW, which can be applied to a first input of the window comparator 162. The second input of the window comparator 162 is shown conceptually as receiving two threshold voltages $V_{TH1}$, $V_{TH2}$. In a non-limiting example implementation, as shown below in FIG. 9, $V_{TH1}>V_{TH2}$, where $V_{TH1}=1.0V$ and $V_{TH2}=-1.0V$.

Figure 9:
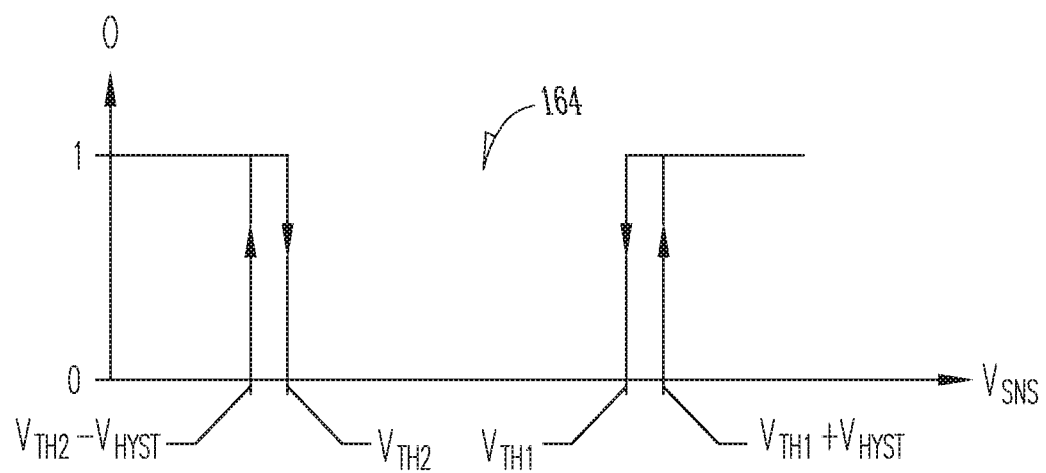
FIG. 9 is an example of a graph of an operation of the window comparator of FIG. 8.

FIG. 9 is an example of a graph of an operation of the window comparator of FIG. 8. The x-axis represents the voltage $V_{SNS}$, which is the output of the subtraction circuit 160 of FIG. 8 and is a differential signal ($V_{SNS}=V_{IN}$-SW) that can be applied to a first input of the window comparator 162 and the y-axis represents the output "O" of the comparator 162 of FIG. 8. The output of the window comparator 162 goes high either when the input voltage $N_{SNS}$ is greater than threshold voltage $V_{TH1}$ (plus some hysteresis voltage $V_{HYST}$ in some example implementations) or when the input voltage $V_{SNS}$ is less than threshold voltage $V_{TH2}$ (minus some hysteresis voltage $V_{HYST}$ in some example implementations). The output of the window comparator 162 goes low when the input voltage $V_{SNS}$ is within a window (shown at 164) of $V_{TH2}<V_{SNS}<V_{TH1}$. In some example implementations, when the enable signal, e.g., enable signal $TG_{BLK}$ or enable signal $BG_{BLK}$, are a first logic level, e.g., logic low, the output of the comparator 162 is latched.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." in this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A circuit configured to detect an open circuit or a short circuit in a switched-mode DC-DC converter having a switching regulator regardless of a direction of a load current, the circuit comprising:
    a first voltage detector circuit coupled across a first transistor, the first voltage detector circuit including a first output and configured to compare a difference of a first reference voltage or an output voltage and a node voltage to a corresponding one of first and second threshold voltages;
    a second voltage detector circuit coupled across a second transistor, the second voltage detector circuit including a second output and configured to compare a difference of a second reference voltage and the node voltage to a corresponding one of first and second threshold voltages; and
    a controller coupled to corresponding control nodes of the first and second transistors to control operation of the first and second transistors, wherein the first output of the first voltage detector circuit is coupled to a first input of the controller, wherein the second output of the second voltage detector circuit is coupled to a second input of the controller, and wherein the controller is configured to detect an open circuit or a short circuit in at least one of the first transistor and the second transistor based on at least one of the comparisons regardless of the direction of the load current in the DC-DC converter.

2. The circuit of claim 1, wherein the first voltage detector circuit includes a first pair of comparator circuits, and wherein the second voltage detector circuit includes a second pair of comparator circuits.

3. The circuit of claim 2, wherein at least one of the comparator circuits includes a hysteresis comparator.

4. The circuit of claim 2, wherein one or both of the first pair of comparator circuits and the second pair of comparator circuits forms a window comparator circuit.

5. The circuit of claim 2, wherein at least one of the comparator circuits includes an enable input configured to receive an enable signal, wherein the enable signal is configured to be set to a first logic level after a predetermined time following application of a second logic level of a control signal to either the first transistor or the second transistor.

6. The circuit of claim 5, wherein the predetermined time is adjustable.

7. The circuit of claim 1, in combination with a buck DC-DC converter.

8. The circuit of claim 1, in combination with a boost DC-DC converter.

9. The circuit of claim 1, in combination with an inverting buck-boost DC-DC converter.

10. The circuit of claim 1, in combination with a non-inverting buck-boost DC-DC, converter.

11. The circuit of claim 10, wherein the node voltage is a first node voltage, the circuit further comprising:
    a third voltage detector circuit coupled across a third transistor, the third voltage detector circuit including a third output and configured to compare a difference of the second reference voltage and a second node voltage to a corresponding one of third and fourth threshold voltages;
    a fourth voltage detector circuit coupled across a fourth transistor, the fourth voltage detector circuit including a fourth output and configured to compare a difference of the output voltage and the second node voltage to a corresponding one of third and fourth threshold voltages,
    wherein the third output of the third voltage detector circuit is coupled to a third input of the controller, wherein the fourth output of the fourth voltage detector circuit is coupled to a fourth input of the controller, and wherein the controller is further configured to detect an open circuit or a short circuit in at least one of the third transistor and the fourth transistor based on at least one of the comparisons regardless of the direction of the load current in the DC-DC converter.

12. The circuit of claim 1, in combination with an H-bridge circuit.

13. The circuit of claim 12, wherein the node voltage is a first node voltage, the circuit further comprising:
    a third voltage detector circuit coupled across a third transistor, the third voltage detector circuit including a third output and configured to compare a difference of the second reference voltage and a second node voltage to a corresponding one of third and fourth threshold voltages;

a fourth voltage detector circuit coupled across a fourth transistor, the fourth voltage detector circuit including a fourth output and configured to compare a difference of the first reference voltage and the second node voltage to a corresponding one of third and fourth threshold voltages, wherein the third output of the third voltage detector circuit is coupled to a third input of the controller, wherein the fourth output of the fourth voltage detector circuit is coupled to a fourth input of the controller, and wherein the controller is further configured to detect an open circuit or a short circuit in at least one of the third transistor and the fourth transistor based on at least one of the comparisons regardless of the direction of the load current in the DC-DC converter.

14. The method of claim 13, wherein the controller is coupled to corresponding controller nodes of third and fourth transistors and controls operation of the third and fourth transistors, and wherein the node voltage is a first node voltage, the method further comprising:

comparing a difference across the third transistor of the second reference voltage and a second node voltage to a corresponding one of third and fourth threshold voltages;

comparing a difference across the fourth transistor of the output voltage and the second node voltage to a corresponding one of third and fourth threshold voltages, detecting an open circuit or a short circuit in at least one of the third transistor and the fourth transistor based on at least one of the comparisons regardless of the direction of the load current in the DC-DC converter.

15. The method of claim 13, wherein the controller is coupled to corresponding controller nodes of third and fourth transistors and controls operation of the third and fourth transistors, and wherein the node voltage is a first node voltage, the method further comprising:

comparing a difference across third transistor of the second reference voltage and a second node voltage to a corresponding one of third and fourth threshold voltages;

comparing a difference across fourth transistor of the first reference voltage and the second node voltage to a corresponding one of third and fourth threshold voltages, detecting an open circuit or a short circuit in at least one of the third transistor and the fourth transistor based on at least one of the comparisons regardless of the direction of the load current in the DC-DC converter.

16. A method of detecting an open circuit or a short circuit in a switched-mode DC-DC converter having a switching regulator regardless of current direction, the method comprising:

controlling, using a controller coupled to corresponding control nodes of first and second transistors, operation of the first and second transistors;

comparing a difference across the first transistor of a first reference voltage or an output voltage and a node voltage to a corresponding one of first and second threshold voltages and outputting a first comparison to a first input of the controller;

comparing a difference across the second transistor of a second reference voltage and the node voltage to a corresponding one of first and second threshold voltages and outputting a second comparison to a first input of the controller; and detecting an open circuit or a short circuit in at least one of the first transistor and the second transistor based on at least one of the first and second comparisons regardless of the direction of the load current in the DC-DC converter.

17. The method of claim 16, further comprising:

receiving an enable signal configured to be set to a first logic level after a predetermined time following application of a second logic level of a control signal to either the first transistor or the second transistor.

18. The method of claim 17, further comprising:

adjusting the predetermined time.

19. A circuit configured to detect an open circuit or a short circuit in a switched-mode DC-DC converter having a switching regulator regardless of a direction of a load current, the circuit comprising:

a first means for comparing a difference across a first transistor of a first reference voltage or an output voltage and a node voltage to a corresponding one of first and second threshold voltages and outputting a first comparison to a first input of the controller;

a second means for comparing a difference across a second transistor of a second reference voltage and the node voltage to a corresponding one of first and second threshold voltages and outputting a second comparison to a second input of the controller; and a controller coupled to corresponding control nodes of the first and second transistors to control operation of the first and second transistors, wherein the first output of the first voltage detector circuit is coupled to a first input of the controller, wherein the second output of the second voltage detector circuit is coupled to a second input of the controller, and wherein the controller is configured to detect an open circuit or a short circuit in at least one of the first transistor and the second transistor based on at least one of the first and second comparisons regardless of the direction of the load current in the DC-DC converter.

20. The circuit of claim 19, wherein the node voltage is a first node voltage, the circuit further comprising:

a third means for comparing a difference across a third transistor of the second reference voltage and a second node voltage to a corresponding one of third and fourth threshold voltages and outputting a third comparison to a third input of the controller;

a fourth means for comparing a difference across a fourth transistor of the output voltage and the second node voltage to a corresponding one of third and fourth threshold voltages and outputting a fourth comparison to a fourth input of the controller, wherein the controller is further configured to detect an open circuit or a short circuit in at least one of the third transistor and the fourth transistor based on at least one of the third and fourth comparisons regardless of the direction of the load current in the DC-DC converter.

* * * * *

UNITED STATES PATENT AND TRADEMARK OFFICE
CERTIFICATE OF CORRECTION

PATENT NO. : 11,079,443 B2
APPLICATION NO. : 16/231008
DATED : August 3, 2021
INVENTOR(S) : Chen et al.

Page 1 of 1

It is certified that error appears in the above-identified patent and that said Letters Patent is hereby corrected as shown below:

In the Specification

In Column 4, Line 23, after "voltage,", insert --e.g.,--

In Column 14, Line 23, delete "$N_{SNS}$" and insert --$V_{SNS}$-- therefor

In Column 14, Line 59, delete "in" and insert --In-- therefor

Signed and Sealed this
Fifteenth Day of February, 2022

Drew Hirshfeld
*Performing the Functions and Duties of the
Under Secretary of Commerce for Intellectual Property and
Director of the United States Patent and Trademark Office*